US012776763B2

(12) United States Patent
Liu et al.

(10) Patent No.: US 12,776,763 B2
(45) Date of Patent: Oct. 27, 2026

(54) PUSH-PULL CURRENT-STARVED VOLTAGE CONTROLLED OSCILLATOR

(71) Applicant: QUALCOMM Incorporated, San Diego, CA (US)

(72) Inventors: Hao Liu, San Diego, CA (US); Lejie Lu, San Diego, CA (US); Yu Song, San Diego, CA (US)

(73) Assignee: QUALCOMM Incorproated, San Diego, CA (US)

( * ) Notice: Subject to any disclaimer, the term of this patent is extended or adjusted under 35 U.S.C. 154(b) by 0 days.

(21) Appl. No.: 19/008,170

(22) Filed: Jan. 2, 2025

(65) Prior Publication Data

US 2026/0189217 A1 Jul. 2, 2026

(51) Int. Cl.
*H03K 3/03* (2006.01)
*H03K 17/687* (2006.01)

(52) U.S. Cl.
CPC ....... *H03K 3/0315* (2013.01); *H03K 17/6872* (2013.01)

(58) Field of Classification Search
CPC .................................................... H03K 3/0315
USPC ............................................................ 331/57
See application file for complete search history.

(56) References Cited

U.S. PATENT DOCUMENTS

| | | | | |
|---|---|---|---|---|
| 5,687,201 A * | 11/1997 | McClellan | H03L 7/0898 | 331/25 |
| 2010/0148838 A1* | 6/2010 | Venkataraman | H03L 7/0816 | 327/543 |
| 2014/0104005 A1* | 4/2014 | Zhang | G05F 3/02 | 331/17 |
| 2019/0222203 A1* | 7/2019 | Tripoli | G05F 1/577 | |

* cited by examiner

*Primary Examiner* — Joseph Chang
(74) *Attorney, Agent, or Firm* — Loza & Loza, LLP

(57) ABSTRACT

A voltage controlled oscillator (VCO) includes a ring oscillator including delay buffers coupled in a loop. The VCO also includes a push-pull circuit having an input and an output, wherein the input of the push-pull circuit is configured to receive a control voltage. The VCO also includes a current mirror having an input terminal and output terminals, wherein the input terminal of the current mirror is coupled to the output of the push-pull circuit and each of the output terminals of the current mirror is coupled to a respective one of the delay buffers. The VCO further includes a current source coupled to the input terminal of the current mirror.

17 Claims, 8 Drawing Sheets

PUSH-PULL CURRENT-STARVED VOLTAGE CONTROLLED OSCILLATOR

FIELD

Aspects of the present disclosure relate generally to oscillators, and more particularly, to voltage controlled oscillators.

BACKGROUND

A voltage controlled oscillator (VCO) generates a signal having a frequency that is controlled (i.e., tuned) by an input voltage. For example, a VCO may be used in a phase-locked loop (PLL) to generate a clock signal, a local oscillator signal, or another type of signal having a desired frequency.

SUMMARY

The following presents a simplified summary of one or more implementations in order to provide a basic understanding of such implementations. This summary is not an extensive overview of all contemplated implementations and is intended to neither identify key or critical elements of all implementations nor delineate the scope of any or all implementations. Its sole purpose is to present some concepts of one or more implementations in a simplified form as a prelude to the more detailed description that is presented later.

A first aspect relates to a voltage controlled oscillator (VCO). The VCO includes a ring oscillator including delay buffers coupled in a loop. The VCO also includes a push-pull circuit having an input and an output, wherein the input of the push-pull circuit is configured to receive a control voltage. The VCO also includes a current mirror having an input terminal and output terminals, wherein the input terminal of the current mirror is coupled to the output of the push-pull circuit and each of the output terminals of the current mirror is coupled to a respective one of the delay buffers. The VCO further includes a current source coupled to the input terminal of the current mirror.

A second aspect relates to a method for operating a voltage controlled oscillator (VCO). The VCO includes a ring oscillator including delay buffers coupled in a loop, a current source, and a push-pull circuit. The method includes driving the push-pull circuit with a control voltage to generate a bidirectional current, combining a current from the current source with the bidirectional current into a combined current, generating a set of currents based on the combined current using a current mirror, and providing each current in the set of currents to a respective one of the delay buffers in the ring oscillator.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

A voltage controlled oscillator (VCO) generates a signal having a frequency that is controlled (i.e., tuned) by an input voltage. For example, a VCO may be used in a phase-locked loop (PLL) to generate a clock signal (e.g., for data sampling), a local oscillator signal (e.g., for frequency conversion), or another type of signal having a desired frequency. In certain aspects, the PLL may be used in a clock data recovery (CDR) circuit to generate a clock signal based on timing information obtained from sampled data bits. However, it is to be appreciated that the PLL is not limited to this example.

Figure 1:
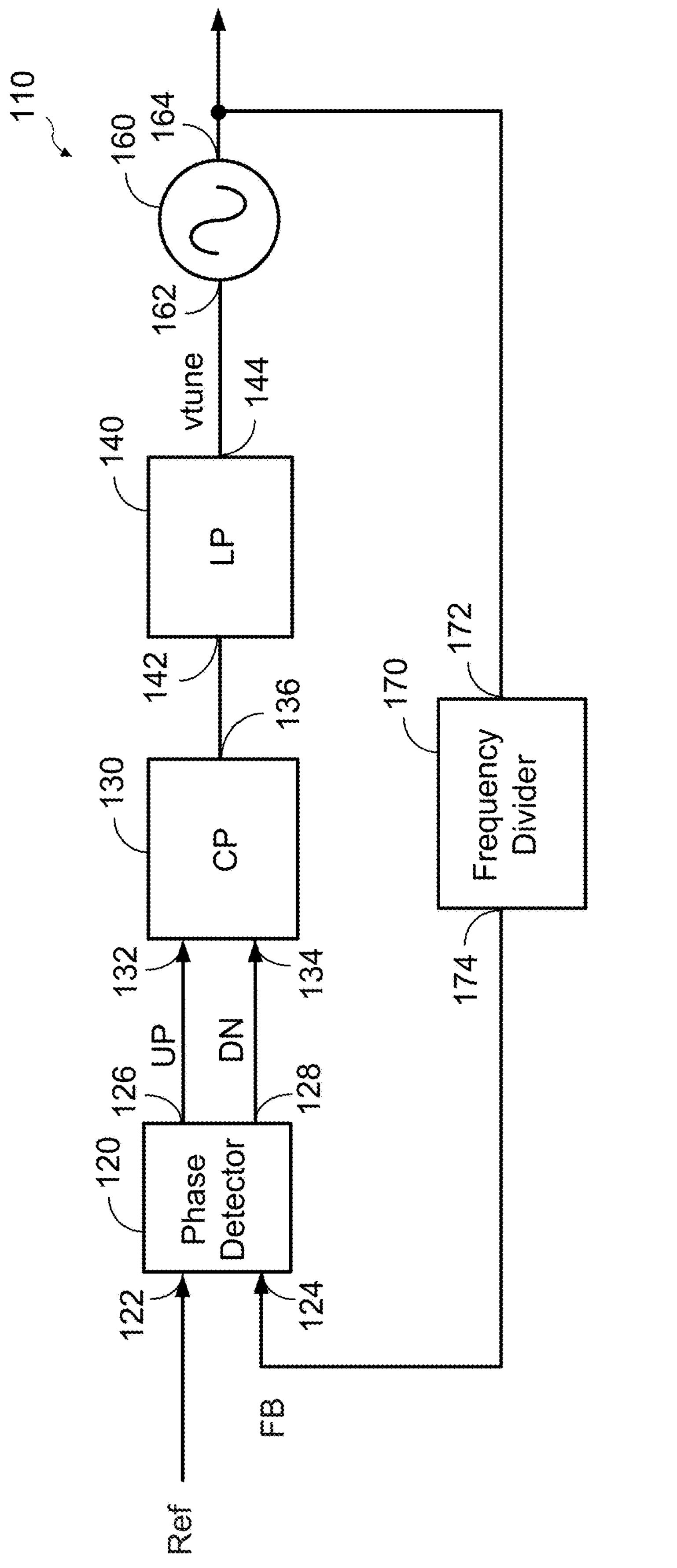
FIG. 1 shows an example of a phase-locked loop (PLL) including a VCO according to certain aspects of the present disclosure.

FIG. 1 shows an example of a PLL 110 including a VCO 160 according to certain aspects of the present disclosure. The PLL 110 may be used to generate a signal having a desired frequency in a serializer/deserializer (SerDes) communication system, a wireless communication system, a micro-processing system, a high-speed data system, etc.

The PLL 110 includes a phase detector 120 (also referred to as a phase frequency detector (PFD)), a charge pump 130, a loop filter 140, the VCO 160, and a frequency divider 170. The VCO 160 has an input 162 configured to receive a control voltage vtune and an output 164 configured to output an output signal. The VCO 160 is configured to tune the frequency of the output signal based on the control voltage vtune. The output signal of the VCO 160 provides the output signal of the PLL 110. The output signal of the PLL 110 may be used as a clock signal, a local oscillator signal, or another type of signal.

The output signal of the VCO 160 is fed back to the phase detector 120 via a feedback loop that includes the frequency divider 170. The frequency divider 170 has an input 172 coupled to the output 164 of the VCO 160 and an output 174 coupled to the phase detector 120. The frequency divider 170 is configured to receive the output signal of the VCO 160 at the input 172, divide the frequency of the output signal to generate a feedback signal (labeled "FB"), and output the feedback signal to the phase detector 120 via the output 174. The feedback signal has a frequency equal to $f_{out}/N$, where $f_{out}$ is the frequency of the output signal of the VCO 160 and N is a divider of the frequency divider 170.

The phase detector 120 has a first input 122 and a second input 124 where the second input 124 is coupled to the output 174 of the frequency divider 170. The phase detector 120 is configured to receive a reference signal (labeled "Ref") at the first input 122 and receive the feedback signal (labeled "FB") at the second input 124. The reference signal provides a reference frequency for the PLL 110 and may come from a crystal oscillator or another stable oscillator. The phase detector 120 is configured to detect a phase difference (i.e., a phase error) between the reference signal and the feedback signal, and generate up/down (UP/DN) signals based on detected phase difference (i.e., phase error). For example, the phase detector 120 may assert the UP signal when the phase of the feedback signal lags the phase of the reference signal and assert the DN signal when the phase of the feedback signal leads the phase of the reference signal, or vice versa. The phase detector 120 outputs the UP signal at a first output 126 and outputs the DN signal at a second output 128.

The charge pump 130 has a first input 132 coupled to the first output 126 of the phase detector 120, a second input 134 coupled to the second output 128 of the phase detector 120, and an output 136 coupled to the loop filter 140. The charge pump 130 sources a charging current to the loop filter 130 when the UP signal is asserted and sinks a discharging current from the loop filter 130 when the DN signal is asserted.

The loop filter 140 has an input 142 coupled to the output 136 of the charge pump 130 and an output 144 coupled to the input 162 of the VCO 160. The loop filter 140 is configured to generate the control voltage vtune based on the charging/discharging currents of the charge pump 130. For example, the loop filter 140 may include a capacitor that integrates the charging/discharging currents to generate the control voltage vtune. However, it is to be appreciated that the loop filter 140 is not limited to this example.

The feedback loop of the PLL 110 causes the control voltage vtune to tune the frequency of the VCO 160 in a direction that reduces the phase difference (i.e., phase error) between the feedback signal and the reference signal. When the PLL 110 is locked, the frequency of the feedback signal is approximately equal to the frequency of the reference signal. Since the frequency of the feedback signal is approximately equal to the frequency of the output signal of the VCO 160 divided by N, this causes the frequency of the output signal of the VCO 160 to be approximately equal to N times the frequency of the reference signal. Thus, the PLL 110 multiplies the frequency of the reference signal by N. For a given reference frequency, the frequency of the output signal of the VCO 160 (which provides the output signal of the PLL 110) may be set to a desired frequency by setting the value of N accordingly.

Figure 2:
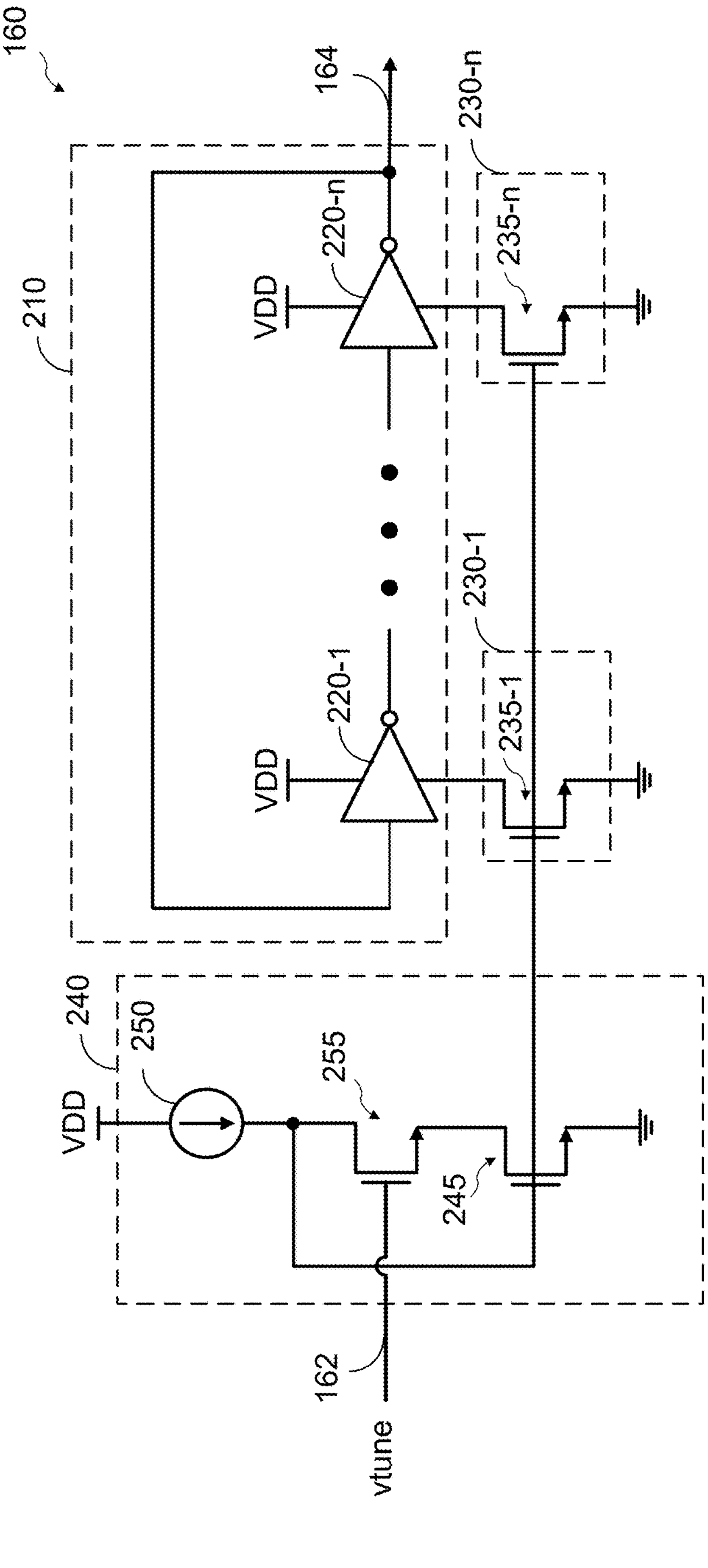
FIG. 2 shows an exemplary implementation of a voltage controlled oscillator (VCO) according to certain aspects of the present disclosure.

The VCO 160 may be implemented using a current-starved ring oscillator. In this regard, FIG. 2 shows an example in which the VCO 160 includes a current-starved ring oscillator 210, tunable current sources 230-1 to **230-*n*, and a current control circuit 240** according to certain aspects.

The ring oscillator 210 includes current-starved delay buffers 220-1 and **220-*n* coupled in a loop. Each of the delay buffers 220-1 to 220-*n* may include a respective current-starved inverter (shown in the example in FIG. 2), but is not limited to this example. As used herein, a "current-starved delay buffer" is a delay buffer having a delay that can be controlled by a current. In the example in FIG. 2, the output of each of the delay buffers 220-1 to 220-*n* is coupled to the input of the next one of the delay buffers 220-1 to 220-*n* in the loop. The oscillation frequency of the ring oscillator 210 may be approximately equal to 1/(2Td) where Td is the sum of the delays of the delay buffers 220-1 to 220-*n*. The output of the ring oscillator 210 is coupled to the output 164 of the VCO 160. Thus, in this example, the output frequency of the VCO 160 is equal to the oscillation frequency of the ring oscillator 210**.

Each of the tunable current sources 230-1 to **230-*n* is coupled to a respective one of the delay buffers 220-1 to 220-*n*. In this example, each of the tunable current sources 230-1 to 230-*n* provides a current to the respective delay buffer 220-1 to 220-*n*. The delay of each of the delay buffers 220-1 to 220-*n* is controlled by the current from the respective current source 230-1 to 230-*n*. Since the oscillation frequency of the ring oscillator 210 depends on the delays of the delay buffers 220-1 to 220-*n*, the oscillation frequency can be tuned by controlling the currents of the current sources 230-1 to 230-*n***.

In this example, the current control circuit 240 is configured to tune the currents of the current sources 230-1 to **230-*n* based on the control voltage vtune. Since the oscillation frequency of the ring oscillator 210 can be tuned by tuning the currents of the current sources 230-1 to 230-*n*, the current control circuit 240 is able to tune the oscillation frequency of the ring oscillator 210 based on the control voltage vtune by tuning the currents of the current sources 230-1 to 230-*n*** based on the control voltage vtune.

In the example shown in FIG. 2, each of the current sources 230-1 to **230-*n* includes a respective transistor 235-1 to 235-*n* (e.g., a respective n-type field effect transistor (NFET)). In certain aspects, each of the transistors 235-1 to 235-*n* may be coupled between the respective delay buffer 220-1 to 220-*n* and ground, in which the drain of the transistor is coupled to the respective delay buffer 220-1 to 220-*n*** and the source of the transistor is coupled to ground.

In the example in FIG. 2, the current control circuit 240 is coupled to the gate of each of the transistors 235-1 to **235-*n*. In this example, the current control circuit 240 controls the currents of the current sources 230-1 to 230-*n* by controlling the gate bias voltage of the transistors 235-1 to 235-*n* based on the control voltage vtune. For the example where each of the transistors 235-1 to 235-*n* is implemented with a respective NFET, the current control circuit 240 may increase the currents of the current sources 230-1 to 230-*n* by increasing the gate bias voltage and decrease the currents of the current sources 230-1 to 230-*n*** by decreasing the gate bias voltage. However, it is to be appreciated that the present disclosure is not limited to this example.

In the example in FIG. 2, the current control circuit 240 includes a first transistor 245 (e.g., first NFET), a second transistor 255 (e.g., second NFET), and a current source 250. The current source 250 is coupled between the supply rail and the drain of the second transistor 255. The supply rail provides the supply voltage VDD. The gate of the second transistor 255 is coupled to the input 162 of the VCO 160 to receive the control voltage vtune. The drain of the first transistor 245 is coupled to the source of the second transistor 255, the gate of the first transistor 245 is coupled to the drain of the second transistor 255, and the source of the first transistor 245 is coupled to a low rail (e.g., a ground rail). As used herein, a "low rail" is a rail having a lower potential (e.g., ground potential) than the supply rail. The gate of the first transistor 245 is coupled to the gates of the transistors 235-1 to **235-*n*. Thus, the voltage at the gate of the first transistor 245** provides the gate bias voltage discussed above.

During operation, the current source 250 generates an approximately constant current that flows through the first transistor 245 and the second transistor 255.

The second transistor 255 is used as a voltage-controlled resistor in which the on resistance of the second transistor

255 is controlled by the control voltage vtune applied to the gate of the second transistor 255. As used here, the "on resistance" of the second transistor 255 is the resistance between the drain and the source of the second transistor 255 when the second transistor 255 is turned on. In this example, the control voltage vtune controls the on resistance of the second transistor 255, which controls the voltage drop across the second transistor 255 and hence controls the drain voltage of the first transistor 245. As a result, the second transistor 255 modulates the drain voltage of the first transistor 245 based on the control voltage vtune.

Since the current flowing through the first transistor 245 from the current source 250 is approximately constant, the drain voltage modulation causes the voltage at the gate of the first transistor 245 (and hence the gate bias voltage of the transistors 235-1 to **235-*n*) to vary with changes in the control voltage vtune. Since the oscillation frequency of the ring oscillator 210 is controlled by the currents of the current sources 230-1 to 230-*n* and the currents of the current sources 230-1 to 230-*n* are controlled by the gate bias voltage, the oscillation frequency of the ring oscillator 210 varies with changes in the control voltage vtune. Thus, in this example, the oscillation frequency of the ring oscillator 210 can be tuned by tuning the control voltage vtune. In this example, the effect of the drain voltage modulation on the gate bias voltage may be enhanced by implementing the first transistor 245** with a short-channel device.

A challenge with the implementation shown in FIG. 2 is that the control voltage vtune needs to be above the threshold voltage of the second transistor 255 in order to turn on the second transistor 255. As a result, the control voltage vtune cannot be used to tune the oscillation frequency of the ring oscillator 210 below the threshold voltage, which can significantly reduce the tunable range of the control voltage vtune. The tunable range is also limited by the drain saturation voltage of the first transistor 245. These limitations may reduce the tunable range of the control voltage vtune to roughly ½ VDD. The reduction in the tunable range of the control voltage vtune translates into a reduction in the tunable range of the output frequency of the VCO 160. The narrow tunable range of the VCO 160 can lead to frequency gaps between programmable frequency bands of the VCO 160.

In addition, VCO programmability is not centralized and the VCO tuning may be non-linear. For example, the VCO gain may decrease as the control voltage vtune approaches the limit set by the drain saturation voltage of the first transistor 245, causing the VCO tuning to become non-linear.

To address the above, aspects of the present disclosure provide a push-pull circuit including at least one push transistor (e.g., p-type field effect transistor (PFET)) and at least one pull transistor (e.g., NFET) that significantly increase the tunable range of the control voltage vtune (e.g., increase the tunable range from roughly ½ VDD in the example in FIG. 2 to rail-to-rail). The increased tunable range of the control voltage vtune translates into a wider tunable range for the output frequency of a VCO. The above features and other features of the present disclosure are discussed further below.

Figure 3:
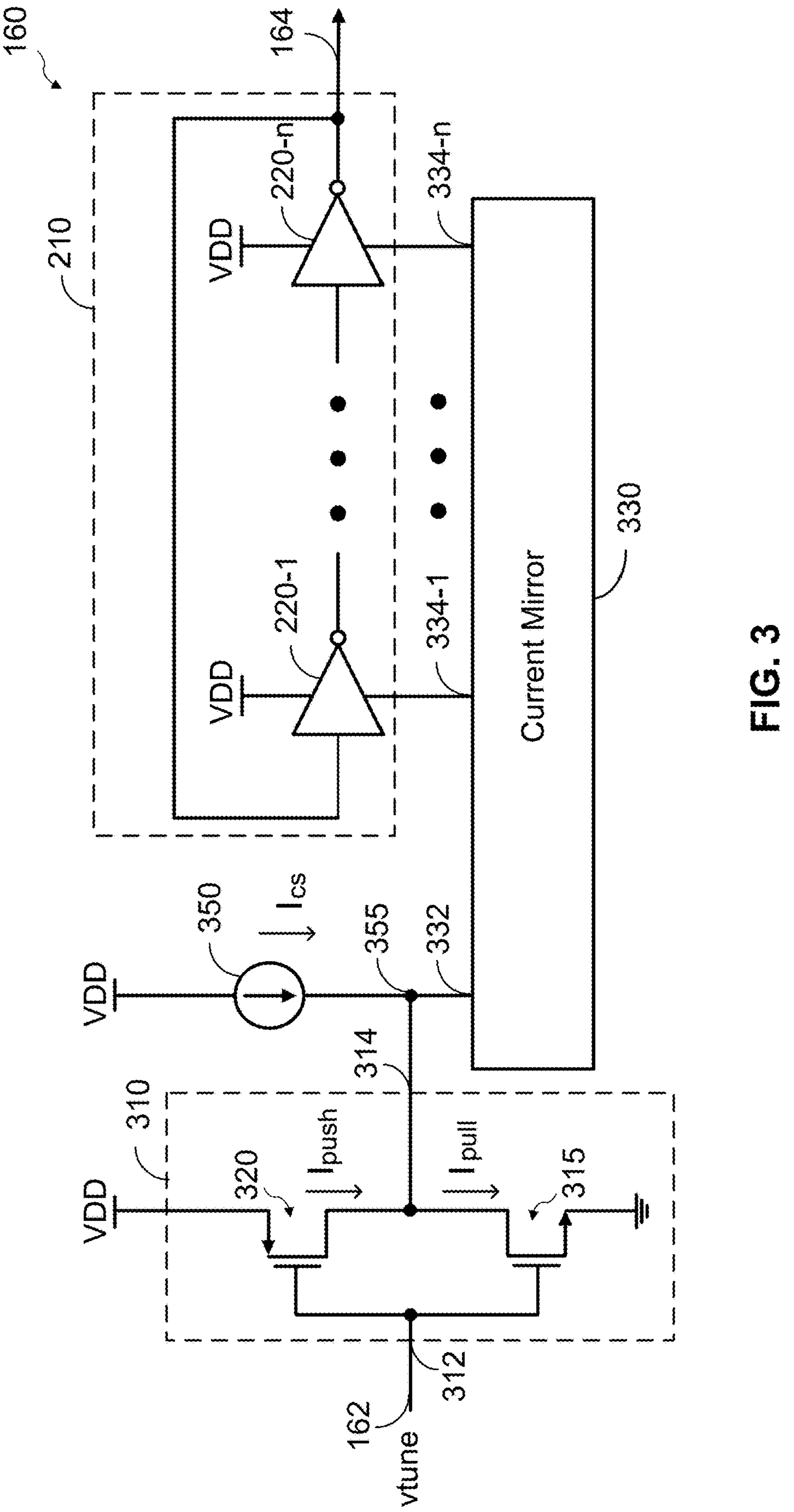
FIG. 3 shows an example of a VCO including a push-pull circuit according to certain aspects of the present disclosure.

FIG. 3 shows an exemplary implementation of the VCO 160 according to certain aspects. In this example, the VCO 160 includes the current-starved ring oscillator 210 discussed above with reference to FIG. 2. The VCO 160 also includes a push-pull circuit 310, a current mirror 330, and a current source 350 according to certain aspects.

The current mirror 330 has an input terminal 332 and output terminals 334-1 to **334-*n*, in which each of the output terminals 334-1 to 334-*n* is coupled to a respective one of the current-starved delay buffers 220-1 to 220-*n*. The current mirror 330 is configured to receive a current at the input terminal 332 and generate a current at each of the output terminals 334-1 to 334-*n* that is approximately equal to or proportional to the current at the input terminal 332. The current at each of the output terminals 334-1 to 334-*n* is provided to the respective one of the current-starved delay buffers 220-1 to 220-*n*. The delay of each of the delay buffers 220-1 to 220-*n* is controlled by the current provided by the respective output terminal 334-1 to 334-*n* of the current mirror 330. Since the oscillation frequency of the ring oscillator 210 depends on the delays of the delay buffers 220-1 to 220-*n*, the oscillation frequency can be tuned by controlling the currents at the output terminals 334-1 to 334-*n* of the current mirror 330**.

In the example in FIG. 3, the current source 350 is coupled between the supply rail and the input terminal 332 of the current mirror 330. The current source 350 is configured to generate a current $I_{cs}$ (e.g., an approximately constant current). It is to be appreciated that the current source 350 may be coupled between the input terminal 332 of the current mirror 330 and the low rail in other implementations.

The push-pull circuit 310 has an input 312 and an output 314. The input 312 is coupled to the input 162 of the VCO 160 to receive the control voltage vtune, and the output 314 is coupled to the input terminal 332 of the current mirror 330. As discussed further below, the push-pull circuit 310 is configured to source current or sink current via the output 314 based on the control voltage vtune.

In the example in FIG. 3, the push-pull circuit 310 includes a pull transistor 315 (e.g., NFET) and a push transistor 320 (e.g., PFET). The source of the push transistor 320 is coupled to the supply rail, the gate of the push transistor 320 is coupled to the input 312, and the drain of the push transistor 320 is coupled to the output 314. The drain of the pull transistor 315 is coupled to the output 314, the gate of the pull transistor 315 is coupled to the input 312, and the source of the pull transistor 315 is coupled to the low rail. In this example, the gate of the push transistor 320 and the gate of the pull transistor 315 are driven by the control voltage vtune at the input 312.

During operation, the push transistor 320 sources the current $I_{push}$ based on the control voltage vtune when the control voltage is below VDD minus the threshold voltage of the push transistor 320. The lower the control voltage vtune, the larger the current $I_{push}$ sourced by the push transistor 320. The current $I_{push}$ sourced by the push transistor 320 may also be referred to as the push current. The pull transistor 315 sinks the current $I_{pull}$ based on the control voltage when the control voltage vtune is above the threshold voltage of the pull transistor 315. The higher the control voltage vtune, the larger the current $I_{pull}$ sunk by the pull transistor 315. The current sunk by the pull transistor 315 may also be referred to as the pull current.

In this example, the current $I_{push}$ sourced by the push transistor 320 based on the control voltage vtune and the current $I_{push}$ sunk by the pull transistor 315 based on the control voltage vtune can be used to tune the amount of current that flows into the input terminal 332 of the current mirror 330 based on the control voltage vtune. For example, when the control voltage is below the threshold voltage of the pull transistor 315, the pull transistor 315 is turned off and the push transistor 320 is turned on and sources the current $I_{push}$ based on the control voltage vtune. The current $I_{push}$ from the push transistor 320 is combined with the current $I_{cs}$ from the current source 350 at node 355 and the combined current (i.e., $I_{push}+I_{cs}$) flows into the input terminal 332 of the current mirror 330. Thus, in this case, the current $I_{push}$ from the push transistor 320 increases the current flowing into the input terminal 332 of the current mirror 330 (and hence increases the currents provided to the current-starved delay buffers 220-1 to **220-*n***) based on the control voltage vtune.

When the control voltage is above VDD minus the threshold voltage of the push transistor 320, the push transistor 320 is turned off and the pull transistor 315 is turned on and sinks the current $I_{pull}$ based on the control voltage vtune. The current $I_{pull}$ sunk by the pull transistor 315 is subtracted from the current $I_{cs}$ of the current source 350 at node 355 and the resulting current (i.e., $I_{cs}-I_{pull}$) flows into the input terminal 332 of the current mirror 330. Thus, in this case, the current $I_{pull}$ from the pull transistor 315 decreases the current flowing into the input terminal 332 of the current mirror 330 (and hence decreases the currents provided to the current-starved delay buffers 220-1 to **220-*n***) based on the control voltage vtune.

When the control voltage is between the threshold voltage of the pull transistor 315 and VDD minus the threshold voltage of the push transistor 320, both the push transistor 320 and the pull transistor 315 are turned on. In this case, the net current of the push-pull circuit 310 is approximately equal to the difference between the current $I_{push}$ of the push transistor 320 and the current $I_{pull}$ of the pull transistor 315 (i.e., $I_{push}-I_{pull}$). The current difference is combined with the current from the current source 350 at the node 355 and the resulting combined current ($I_{cs}+I_{push}-I_{pull}$) flows into the input terminal 332 of the current mirror 330. When the current $I_{push}$ of the push transistor 320 and the current $I_{pull}$ of the pull transistor 315 are approximately equal, the net current of the push-pull circuit 310 is approximately zero and the current flowing into the input terminal 332 of the current mirror 330 is approximately equal to the current $I_{cs}$ of the current source 350.

In this example, the current $I_{push}$ from the push transistor 320 and/or the current $I_{pull}$ from the pull transistor 315 tune the current flowing into the input terminal 332 of the current mirror 330 based on the control voltage vtune. This causes the current mirror 330 to tune the currents provided to the current-starved delay buffers 220-1 to **220-*n* based on the control voltage vtune, which, in turn, tunes the output frequency of the VCO 160. Thus, the push-pull circuit 310 and the current mirror 330 tune the output frequency of the VCO 160** based on the control voltage vtune.

Figure 4:
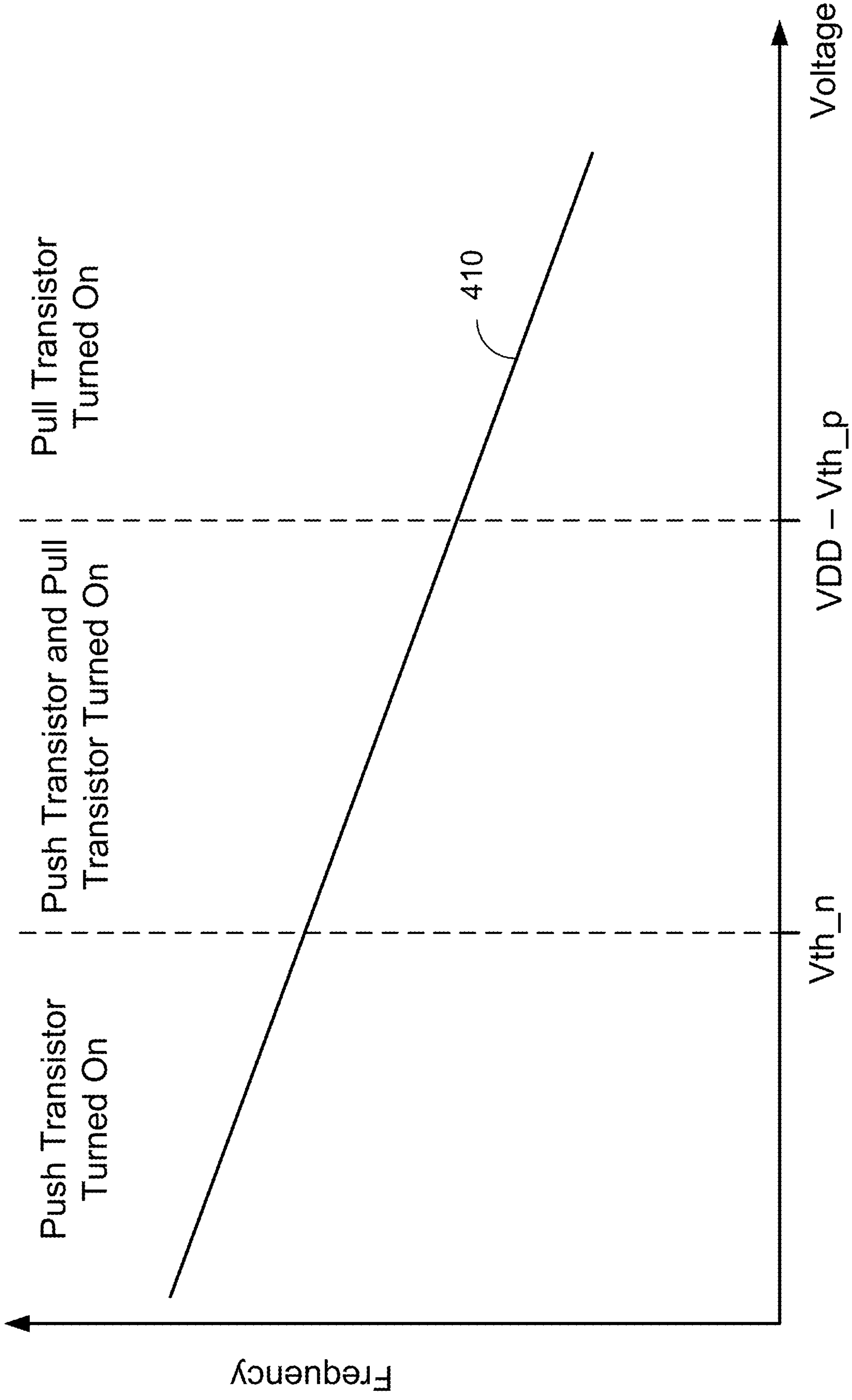
FIG. 4 is a plot illustrating a wide tunable range for the VCO of FIG. 3 shows according to certain aspects of the present disclosure.

In this example, the push transistor 320 and the pull transistor 315 significantly increase the tunable range of the control voltage vtune (e.g., increase the tunable range from roughly ½ VDD in the example in FIG. 2 to rail-to-rail). The increased tunable range of the control voltage vtune translates into a wider tunable range for the output frequency of the VCO 160. An example of the wider tunable range is illustrated in FIG. 4, which shows an exemplary plot of the output frequency of the VCO 160 versus the control voltage vtune. In the example in FIG. 4, the output frequency is depicted as being a linear function of the control voltage vtune for ease of illustration (i.e., the output frequency versus the control voltage vtune is a depicted as a straight line 410). However, it is to be appreciated that, in practice, the output frequency may deviate somewhat from the straight line 410 shown in FIG. 4 due to some non-linearity.

As shown in FIG. 4, when the control voltage vtune is below the threshold voltage of the pull transistor 315 (labeled "Vth_n" in FIG. 4), the push transistor 320 is turned on and sources the current $I_{push}$ based on the control voltage vtune. The current $I_{push}$ sourced by the push transistor 320 varies with changes in the control voltage vtune applied to the gate of the push transistor 320. This causes the current flowing into the input terminal 332 of the current mirror 330 to vary with changes in the control voltage vtune, which, in turn, causes the currents provided to the current-starved delay buffers 220-1 to **220-*n* and the output frequency to vary with changes in the control voltage vtune. Thus, the push transistor 320 extends the tunable range of the control voltage vtune below the threshold voltage of the pull transistor 315. In contrast, in the example in FIG. 2, the control voltage vtune cannot be tuned below the threshold voltage of the second transistor 255**, as discussed above.

When the control voltage is above VDD minus the threshold voltage of the push transistor 320 (labeled "Vth_p" in FIG. 4), the pull transistor 315 is turned on and sinks the current $I_{pull}$ based on the control voltage vtune. The current $I_{pull}$ sunk by the pull transistor 315 varies with changes in the control voltage vtune applied to the gate of the pull transistor 315. This causes the current flowing into the input terminal 332 of the current mirror 330 to vary with changes in the control voltage vtune, which, in turn, causes the currents provided to the current-starved delay buffers 220-1 to **220-*n* and the output frequency to vary with changes in the control voltage vtune. Thus, the pull transistor 315 allows the control voltage vtune to be tuned above VDD minus the threshold voltage of the push transistor 320** (i.e., VDD−Vth_p).

When the control voltage vtune is between the threshold voltage of the pull transistor 315 (i.e., Vth_n) and VDD minus the threshold voltage of the push transistor 320 (i.e., VDD−Vth_p), both the push transistor 320 and the pull transistor 315 are turned on. In this case, both the push transistor 320 and the pull transistor 315 allow the control voltage to be tuned.

In the example shown in FIG. 4, the push transistor 320 and the pull transistor 315 extend the tunable range of the control voltage vtune to approximately rail-to-rail (i.e., from the low rail to the supply rail). The wider tunable range of the control voltage vtune translates into a wider tunable range for the output frequency of the VCO 160.

Figure 5:
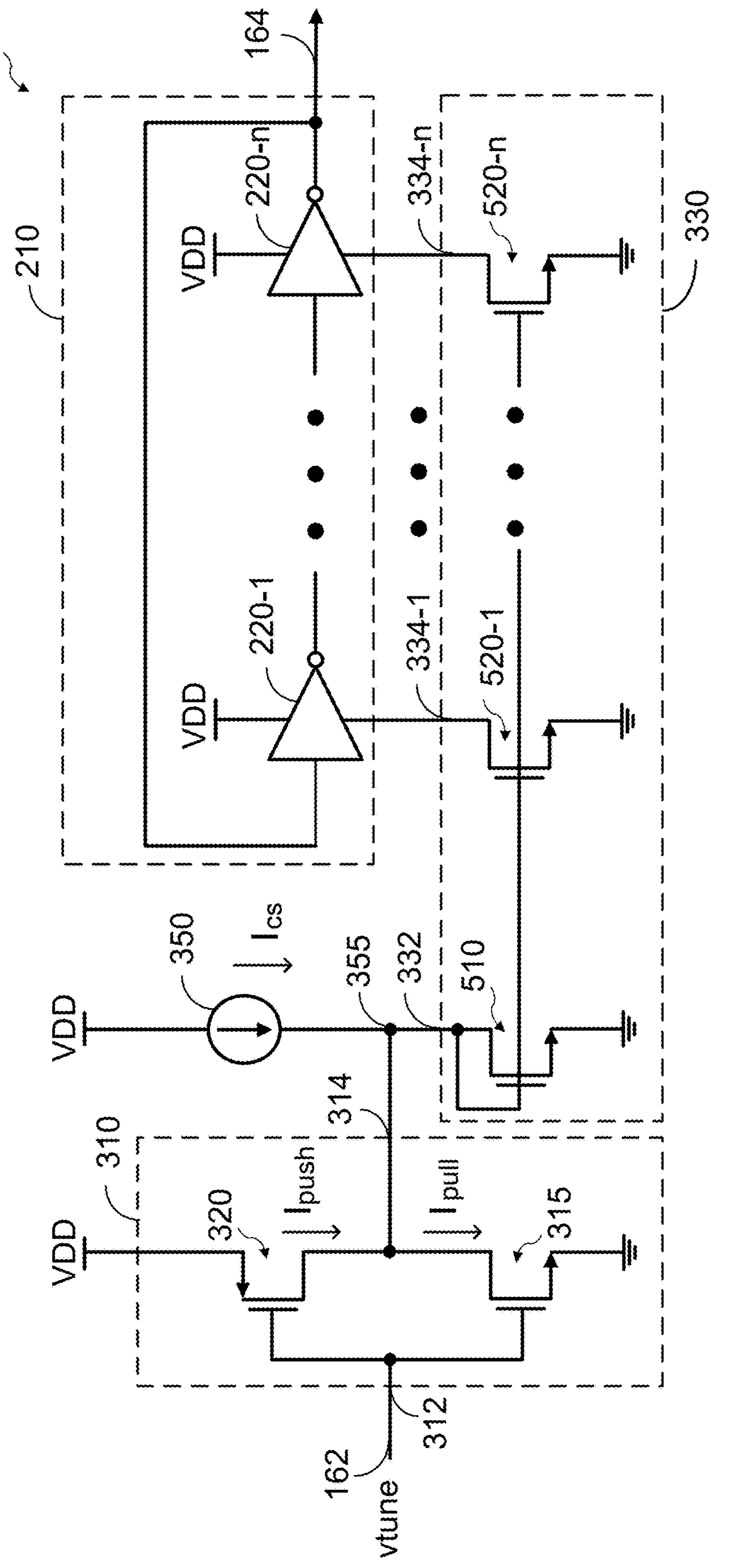
FIG. 5 shows an exemplary implementation of a current mirror according to certain aspects of the present disclosure.

FIG. 5 shows an exemplary implementation of the current mirror 330 according to certain aspects. In this example, the current mirror 330 includes transistors 520-1 to **520-*n* (e.g., NFETs) where each of the transistors 520-1 to 520-*n* is coupled between a respective one of the output terminals 334-1 to 334-*n* and the low rail (e.g., ground rail). In certain aspects, the drain of each transistor 520-1 to 520-*n* is coupled to the respective output terminal 334-1 to 334-*n* and the source of each transistor 520-1 to 520-*n* is coupled to the low rail (e.g., ground rail). Each of the transistors 520-1 to 520-*n* may also be referred to as a current transistor since each of the transistors 520-1 to 520-*n* provides current for the respective one of the delay buffers 220-1 to 220-*n***.

The current mirror 330 also includes a bias transistor 510 (e.g., NFET) in which the drain and the gate of the transistor 510 are coupled together, the gate of the transistor 510 is coupled to the gates of the transistors 520-1 to **520-*n*, and the source of the transistor 510 is coupled to the low rail (e.g., ground rail). The drain of the transistor 510 is coupled to the input terminal 332 of the current mirror 330. As a result, the current flowing into the input terminal 332 flows through the transistor 510. This causes the transistor 510 to bias the gates of the transistors 520-1 to 520-*n* such that the current of each of the transistors 520-1 to 520-*n* is approximately equal to or proportional to the current flowing through the transistor 510 (e.g., depending on the channel width of the transistors 510 and the channel widths of the transistors 520-1 to 520-*n*). However, it is to be appreciated that the current mirror 330 is not limited to the exemplary implementation shown in FIG. 5**.

Figure 6:
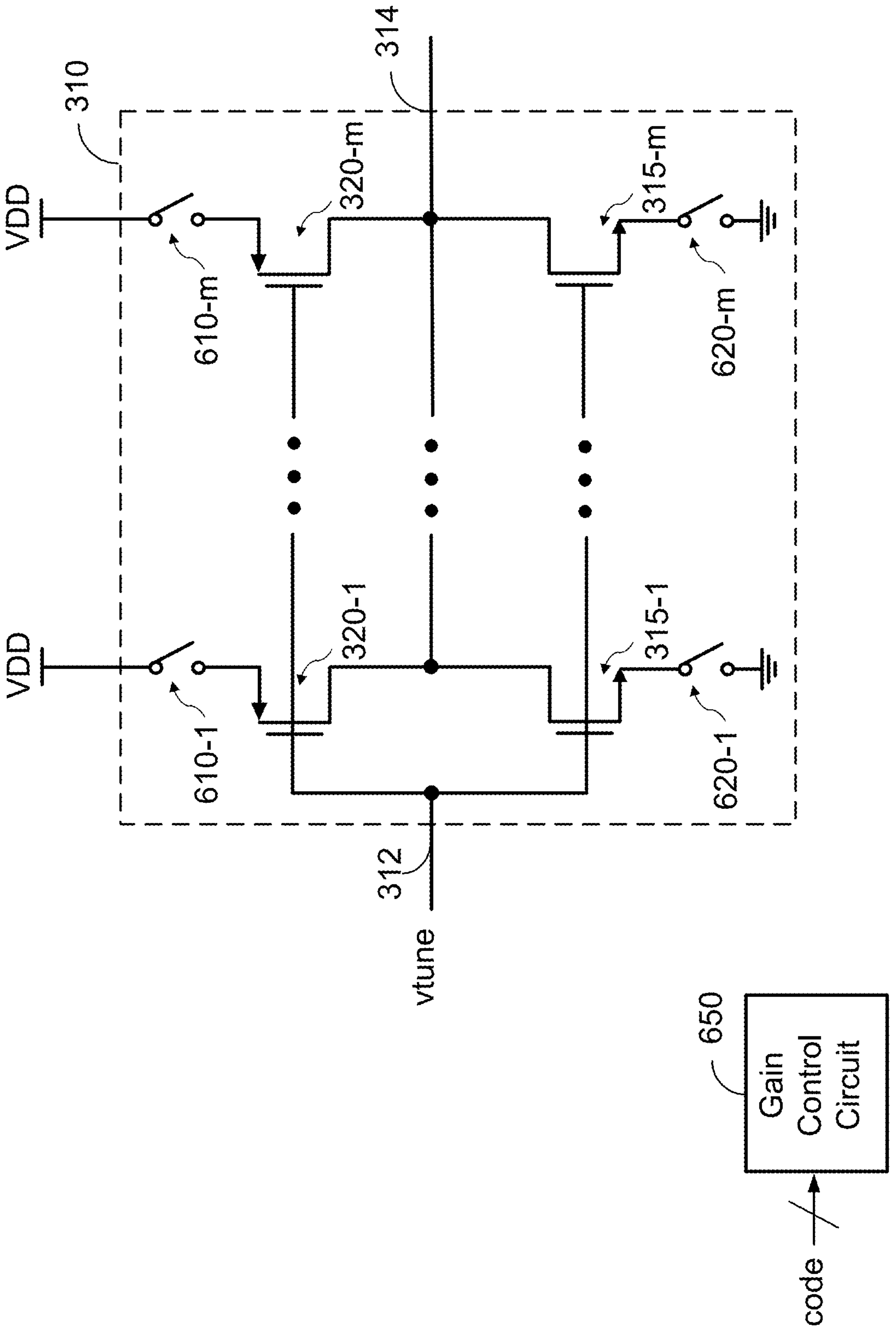
FIG. 6 shows an example in which the push-pull circuit provides programmable VCO gain according to certain aspects of the present disclosure.

FIG. 6 shows an example in which the push-pull circuit 310 has a programmable push strength and a programmable pull strength that provide the VCO 160 with programmable gain according to certain aspects. The gain of a VCO may be given by a change in output frequency over a change in control voltage vtune and may be measured in hertz per volt.

In this example, the push-pull circuit 310 includes push transistors 320-1 to **320-*m* (e.g., PFETs), pull transistors 315-1 to 315-*m* (e.g., NFETs), first switches 610-1 to 610-*m*, and second switches 620-1 to 620-*m*. Each of the push transistors 320-1 to 320-*m* is coupled in series with a respective one of the first switches 610-1 to 610-*m* between the supply rail and the output 314. Each of the pull transistors 315-1 to 315-*m* is coupled in series with a respective one of the second switches 620-1 to 620-*m* between the output 314 and the low rail (e.g., ground rail). As discussed above, the output 314 is coupled to the input terminal 332 of the current mirror 330 (not shown in FIG. 6). The gate of each of the pull transistors 315-1 to 315-*m* and the gate of each of the push transistors 320-1 to 320-*m* is coupled to the input 312**, which receive the control voltage vtune.

In this example, each of the push transistors 320-1 to **320-*m* is enabled by closing (i.e., turning on) the respective first switch 610-1 to 610-*m* and disabled by opening (i.e., turning off) the respective first switch 610-1 to 610-*m*. Each of the pull transistors 315-1 to 315-*m* is enabled by closing (i.e., turning on) the respective second switch 620-1 to 620-*m* and disabled by opening (i.e., turning off) the respective second switch 620-1 to 620-*m*. In certain aspects, the on/off states of the switches 610-1 to 610-*m* and 620-1 to 620-*m* are controlled by a gain control circuit 650. As discussed further below, the gain control circuit 650 controls the push strength and the pull strength of the push-pull circuit 310 by controlling the number of pairs of the push transistors 320-1 to 320-*m* and the pull transistors 315-1 to 315-*m* that are enabled using the switches 610-1 to 610-*m* and 620-1 to 620-*m***.

The gain control circuit 650 is configured to receive a digital code and control the number of pairs of the push transistors 320-1 to **320-*m* and the pull transistors 315-1 to 315-*m* that are enabled based on the digital code. For example, the digital code may have multiple possible values where each of the possible values indicates a respective number of pairs of the push transistors 320-1 to 320-*m* and the pull transistors 315-1 to 315-*m* that are to be enabled. In this example, the gain control circuit 650 receives the code and enables the number of pairs of the push transistors 320-1 to 320-*m* and the pull transistors 315-1 to 315-*m* indicated by the value of the code. For example, if the value of the code indicates that five pairs of the push transistors 320-1 to 320-*m* and the pull transistors 315-1 to 315-*m* are to be enabled, then the gain control circuit 650 enables five of the push transistors 320-1 to 320-*m* (e.g., by closing five of the first switches 610-1 to 610-*m*) and enables five of the pull transistors 315-1 to 315-*m* (by closing five of the second switches 620-1 to 620-*m***). Each possible value of the digital code may correspond to a respective sequence of bit values.

In this example, enabling a larger number of pairs of the push transistors 320-1 to **320-*m* and the pull transistors 315-1 to 315-*m* increases the push strength and the pull strength of the push-pull circuit 310 while enabling a smaller number of pairs of the push transistors 320-1 to 320-*m* and the pull transistors 315-1 to 315-*m* decreases the push strength and the pull strength of the push-pull circuit 310. Thus, in this example, the gain control circuit 650 is able to program the push strength and the pull strength of the push-pull circuit 310 based on the code by controlling the number of pairs of the push transistors 320-1 to 320-*m* and the pull transistors 315-1 to 315-*m*** that are enabled based on the code.

In this example, the gain of the VCO 160 depends on the push strength and the pull strength of the push-pull circuit 310. Increasing the push strength and the pull strength increases the VCO gain while decreasing the push strength and the pull strength decreases the VCO gain. Thus, in this example, the gain control circuit 650 is able to control the VCO gain based on the code by programming the push strength and the pull strength of the push-pull circuit 310 based on the code.

Figure 7:
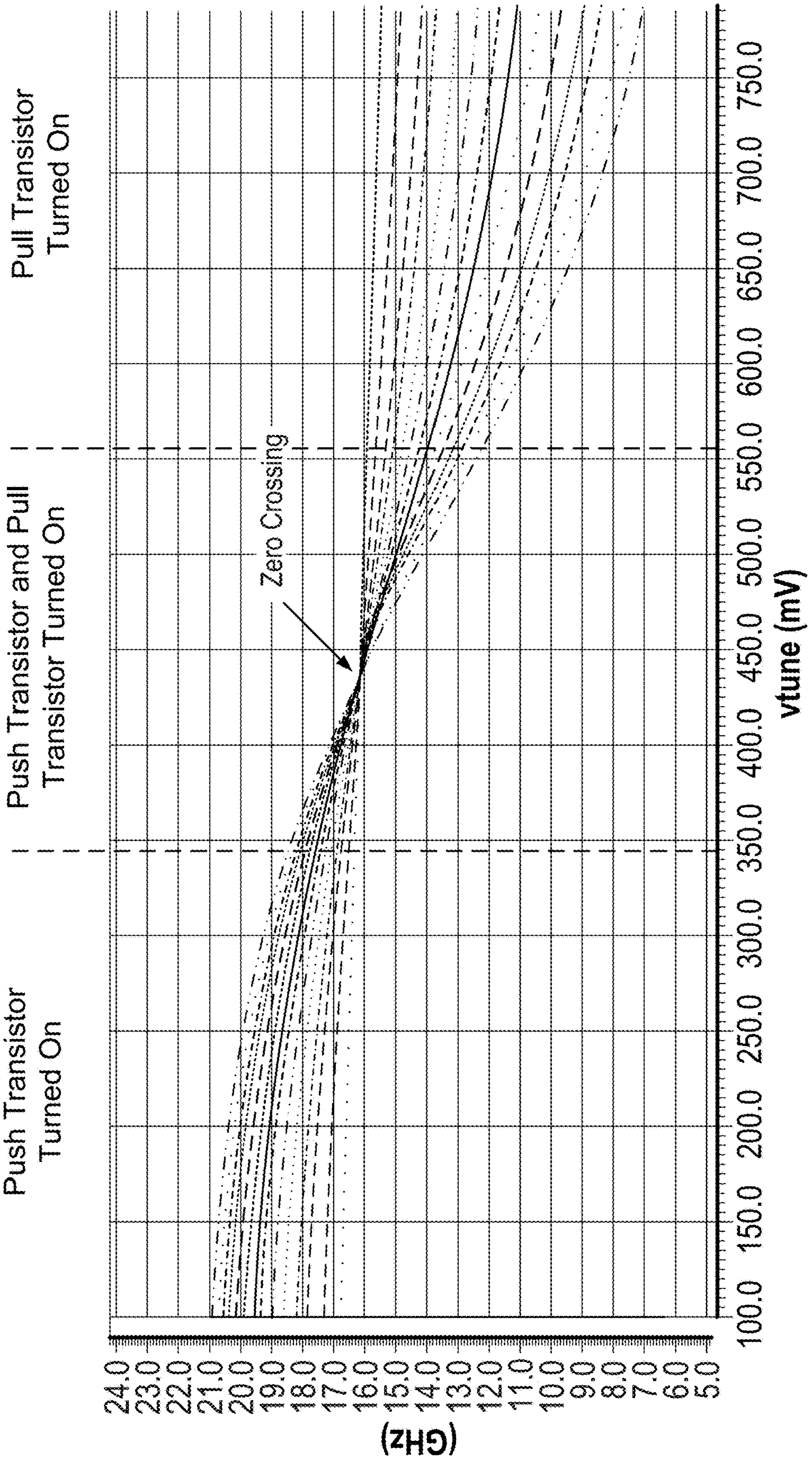
FIG. 7 is a plot illustrating different gain settings for the VCO according to certain aspects of the present disclosure.

FIG. 7 is a plot showing exemplary output frequency versus the control voltage vtune curves for different gain settings according to certain aspects. Each of the gain settings may correspond to a different one of the code values discussed above. In the example in FIG. 7, the curves for the different gain settings cross at approximately the center of the tunable range of the control voltage vtune. The crossing of the curves occurs when the push current $I_{push}$ and the pull current $I_{pull}$ of the push-pull circuit 310 are approximately equal. In this case, the current flowing into the input terminal 332 of the current mirror 330 is approximately equal to the current $I_{cs}$ of the current source 350. In this example, the push-pull architecture helps ensure centralization of the zero point across the different code values.

In certain aspects, the current mirror 330 may have a tunable current ratio (i.e., current gain), in which the current ratio is a ratio of the current at each of the output terminals 334-1 to **334-*n* over the current at the input terminal 332. For example, the current ratio of the current mirror 330 may be programmed to any one of multiple selectable current ratios based on a digital code. In this example, each of the selectable current ratios may correspond to a different one of multiple frequency bands. This allows one of the frequency bands to be selected for the VCO 160 at a given time by programming the current mirror 330 with the corresponding current ratio. Once a frequency band is selected, the output frequency of the VCO 160** may be tuned within the selected frequency band by tuning the control voltage vtune, as discussed above.

In certain aspects, the current mirror 330 may include multiple bias transistors (e.g., multiple instances of the bias transistor 510) in which each of the bias transistor can be selectively enable or disabled with a respective switch based on the code. In this example, the current ratio of the current mirror 330 (and hence the frequency band) may be programmed by controlling the number of the bias transistors that are enabled.

Figure 8:
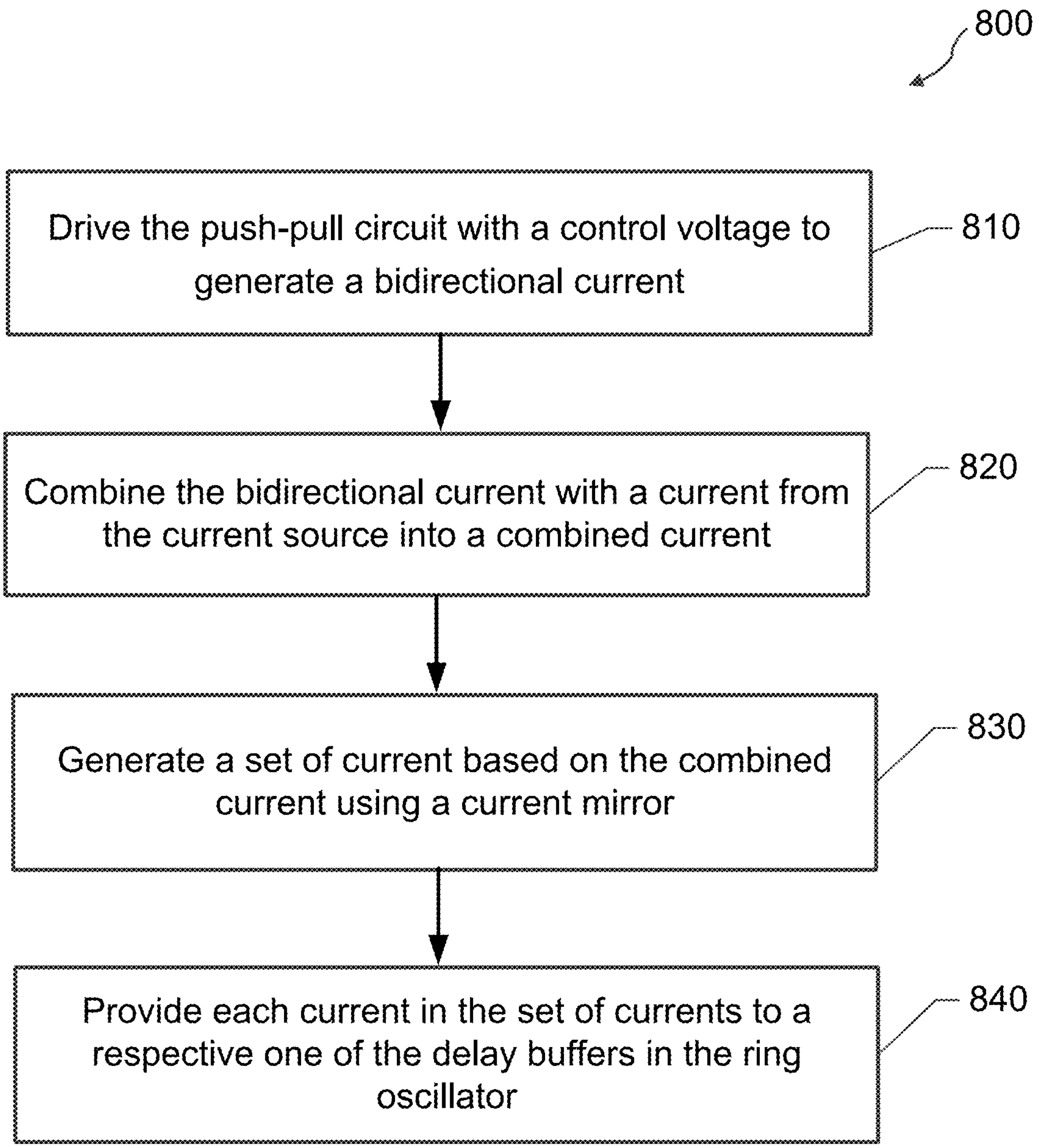
FIG. 8 is a flowchart illustrating a method for operating a VCO according to certain aspects of the present disclosure.

FIG. 8 illustrates a method 800 for operating a voltage controlled oscillator (VCO) according to certain aspects. The VCO (e.g., the VCO 160) includes a ring oscillator (e.g., ring oscillator 210) including delay buffers (e.g., delay buffers 220-1 to **220-*n*) coupled in a loop, a current source (e.g., current source 350), and a push-pull circuit (e.g., push-pull circuit 310**).

At block 810, the push-pull circuit is driven with a control voltage to generate a bidirectional current. For example, the control voltage may correspond to the control voltage vtune.

As used herein, a bidirectional current is a current that can flow in either direction (e.g., based on the control voltage vtune). For example, the bidirectional current may include the push current $I_{push}$ and/or the pull current $I_{pull}$ of the push-pull circuit 310.

At block 820, a current from the current source is combined with the bidirectional current into a combined current. For example, the current from the current source and the bidirectional current may be combined at the node 355. The bidirectional current may either add to or subtract from the current from the current source depending on the direction of the bidirectional current.

At block 830, a set of currents is generated based on the combined current using a current mirror. For example, the current mirror may correspond to the current mirror 330. In certain aspects, each current in the set of currents corresponds to the current at a respective one of the output terminals 334-1 to **334-*n* of the current mirror 330**.

At block 840, each current in the set of currents is provided to a respective one of the delay buffers in the ring oscillator.

In certain aspects, the push-pull circuit includes a push transistor (e.g., push transistor 320) coupled between a supply rail and an output of the push-pull circuit and a pull transistor (e.g., pull transistor 315) coupled between the output of the push-pull circuit and a low rail. In these aspects, driving the push-pull circuit with the control voltage to generate the bidirectional current includes driving a gate of the push transistor with the control voltage and driving a gate of the pull transistor with the control voltage. In certain aspects, the push transistor includes a p-type field effect transistor (PFET) and the pull transistor includes an n-type field effect transistor (NFET).

Implementation examples are described in the following numbered clauses:

1. A voltage controlled oscillator (VCO), comprising:
 a ring oscillator including delay buffers coupled in a loop;
 a push-pull circuit having an input and an output, wherein the input of the push-pull circuit is configured to receive a control voltage;
 a current mirror having an input terminal and output terminals, wherein the input terminal of the current mirror is coupled to the output of the push-pull circuit and each of the output terminals of the current mirror is coupled to a respective one of the delay buffers; and
 a current source coupled to the input terminal of the current mirror.

2. The VCO of clause 1, wherein current source is coupled between a rail and the input terminal of the current mirror.

3. The VCO of clause 1 or 2, wherein the push-pull circuit comprises:
 a push transistor coupled between a supply rail and the output of the push-pull circuit, wherein a gate of the push transistor is coupled to the input of the push-pull circuit; and
 a pull transistor coupled between the output of the push-pull circuit and a low rail, wherein a gate of the pull transistor is coupled to the input of the push-pull circuit.

4. The VCO of clause 3, wherein the push transistor comprises a p-type field effect transistor (PFET) and the pull transistor comprises an n-type field effect transistor (NFET).

5. The VCO of clause 3 or 4, wherein the current source is coupled between the supply rail and the input terminal of the current mirror.

6. The VCO of any one of clauses 3 to 5, wherein each of the delay buffers comprises a respective current-starved inverter.

7. The VCO of any one of clauses 1 to 6, wherein the push-pull circuit comprises:
 push transistors, wherein a gate each of the push transistors is coupled to the input of the push-pull circuit;
 first switches, wherein each of the first switches is coupled in series with a respective one of the push transistors between a supply rail and the output of the push-pull circuit;
 pull transistors, wherein a gate each of the pull transistors is coupled to the input of the push-pull circuit; and
 second switches, wherein each of the second switches is coupled in series with a respective one of the pull transistors between the output of the push-pull circuit and a low rail.

8. The VCO of clause 7, wherein the each of the push transistors comprises a respective p-type field effect transistor (PFET) and each of the pull transistors comprises a respective n-type field effect transistor (NFET).

9. The VCO of clause 7 or 8, wherein the current source is coupled between the supply rail and the input terminal of the current mirror.

10. The VCO of any one of clauses 7 to 9, further comprising a control circuit configured to receive a digital code and control on/off states of the first switches and on/off states of the second switches based on the digital code.

11. The VCO of any one of clauses 1 to 10, wherein the current mirror comprises:
 a bias transistor, wherein a drain of the bias transistor is coupled to the input terminal of the current mirror, and the drain of the bias transistor is coupled to a gate of the bias transistor; and
 current transistors, wherein a drain of each of the current transistors is coupled to a respective one of the output terminals of the current mirror, and a gate of the each of the current transistors is coupled to the gate of the bias transistor.

12. The VCO of clause 11, wherein the current source is coupled between a supply rail and the input terminal of the current mirror, a source of the bias transistor is coupled to a low rail, and a source of each of the current transistors is coupled to the low rail.

13. The VCO of clause 12, wherein the push-pull circuit comprises:
 a push transistor coupled between the supply rail and the output of the push-pull circuit, wherein a gate of the push transistor is coupled to the input of the push-pull circuit; and
 a pull transistor coupled between the output of the push-pull circuit and the low rail, wherein a gate of the pull transistor is coupled to the input of the push-pull circuit.

14. The VCO of clause 13, wherein the push transistor comprises a p-type field effect transistor (PFET) and the pull transistor comprises an n-type field effect transistor (NFET).

15. The VCO of clause 13 or 14, wherein each of the delay buffers comprises a respective current-starved inverter.

16. A method for operating a voltage controlled oscillator (VCO), wherein the VCO includes a ring oscillator including delay buffers coupled in a loop, a current source, and a push-pull circuit, the method comprising
 driving the push-pull circuit with a control voltage to generate a bidirectional current;
 combining a current from the current source with the bidirectional current into a combined current;

generating a set of currents based on the combined current using a current mirror; and providing each current in the set of currents to a respective one of the delay buffers in the ring oscillator.

17. The method of clause 16, wherein:

the push-pull circuit includes a push transistor coupled between a supply rail and an output of the push-pull circuit;

the push-pull circuit includes a pull transistor coupled between the output of the push-pull circuit and a low rail; and driving the push-pull circuit with the control voltage to generate the bidirectional current comprises driving a gate of the push transistor with the control voltage and driving a gate of the pull transistor with the control voltage.

18. The method of clause 17, wherein the push transistor comprises a p-type field effect transistor (PFET) and the pull transistor comprises an n-type field effect transistor (NFET).

19. The method of any one of clauses 16 to 18, wherein each of the delay buffers comprises a current-starved inverter.

The gain control circuit 650 may be implemented with a general-purpose processor, a digital signal processor (DSP), an application specific integrated circuit (ASIC), a field programmable gate array (FPGA) or other programmable logic device, a digital finite state machine (FSM), discrete hardware components (e.g., logic gates), or any combination thereof designed to perform the functions described herein. A processor may perform the functions described herein by executing software comprising code for performing the functions. The software may be stored on a computer-readable storage medium, such as a RAM, a ROM, an EEPROM, an optical disk, and/or a magnetic disk.

Within the present disclosure, the word “exemplary” is used to mean “serving as an example, instance, or illustration.” Any implementation or aspect described herein as “exemplary” is not necessarily to be construed as preferred or advantageous over other aspects of the disclosure. Likewise, the term “aspects” does not require that all aspects of the disclosure include the discussed feature, advantage or mode of operation. The term “coupled” is used herein to refer to the direct or indirect electrical coupling between two structures. It is also to be appreciated that the term “ground” may refer to a DC ground or an AC ground, and thus the term “ground” covers both possibilities. As used herein, “approximately” means within 90 percent of the stated value to 110 percent of the stated value.

Any reference to an element herein using a designation such as “first,” “second,” and so forth does not generally limit the quantity or order of those elements. Rather, these designations are used herein as a convenient way of distinguishing between two or more elements or instances of an element. Thus, a reference to first and second elements does not mean that only two elements can be employed, or that the first element must precede the second element.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A voltage controlled oscillator (VCO), comprising:

a ring oscillator including delay buffers coupled in a loop;

a current mirror having an input terminal and output terminals, wherein each of the output terminals of the current mirror is coupled to a respective one of the delay buffers;

a current source coupled to the input terminal of the current mirror; and a push-pull circuit having an input and an output, wherein the input of the push-pull circuit is configured to receive a control voltage, the output of the push-pull circuit is coupled to the input terminal of the current mirror, and the push-pull circuit comprises:

a push transistor coupled between a supply rail and the output of the push-pull circuit, wherein a gate of the push transistor is coupled to the input of the push-pull circuit; and a pull transistor coupled between the output of the push-pull circuit and a low rail, wherein a gate of the pull transistor is coupled to the input of the push-pull circuit, and the control voltage is applied to both the gate of the push transistor and the gate of the pull transistor.

2. The VCO of claim 1, wherein the current source is coupled between the supply rail and the input terminal of the current mirror.

3. The VCO of claim 1, wherein the push transistor comprises a p-type field effect transistor (PFET) and the pull transistor comprises an n-type field effect transistor (NFET).

4. The VCO of claim 1, wherein each of the delay buffers comprises a respective current-starved inverter.

5. A voltage controlled oscillator (VCO), comprising:

a ring oscillator including delay buffers coupled in a loop;

a current mirror having an input terminal and output terminals, wherein each of the output terminals of the current mirror is coupled to a respective one of the delay buffers;

a current source coupled to the input terminal of the current mirror; and a push-pull circuit having an input and an output, wherein the input of the push-pull circuit is configured to receive a control voltage, the output of the push-pull circuit is coupled to the input terminal of the current mirror, and the push-pull circuit comprises:

push transistors, wherein a gate each of the push transistors is coupled to the input of the push-pull circuit;

first switches, wherein each of the first switches is coupled in series with a respective one of the push transistors between a supply rail and the output of the push-pull circuit;

pull transistors, wherein a gate each of the pull transistors is coupled to the input of the push-pull circuit, and the control voltage is applied to both the gates of the push transistors and the gates of the pull transistors; and second switches, wherein each of the second switches is coupled in series with a respective one of the pull transistors between the output of the push-pull circuit and a low rail.

6. The VCO of claim 5, wherein the each of the push transistors comprises a respective p-type field effect transistor (PFET) and each of the pull transistors comprises a respective n-type field effect transistor (NFET).

7. The VCO of claim 5, wherein the current source is coupled between the supply rail and the input terminal of the current mirror.

8. The VCO of claim 5, further comprising a control circuit configured to receive a digital code and control on/off states of the first switches and on/off states of the second switches based on the digital code.

9. The VCO of claim 1, wherein the current mirror comprises:

a bias transistor, wherein a drain of the bias transistor is coupled to the input terminal of the current mirror, and the drain of the bias transistor is coupled to a gate of the bias transistor; and current transistors, wherein a drain of each of the current transistors is coupled to a respective one of the output terminals of the current mirror, and a gate of the each of the current transistors is coupled to the gate of the bias transistor.

10. The VCO of claim 9, wherein the current source is coupled between the supply rail and the input terminal of the current mirror, a source of the bias transistor is coupled to a low rail, and a source of each of the current transistors is coupled to the low rail.

11. The VCO of claim 10, wherein the push transistor comprises a p-type field effect transistor (PFET) and the pull transistor comprises an n-type field effect transistor (NFET).

12. The VCO of claim 10, wherein each of the delay buffers comprises a respective current-starved inverter.

13. A method for operating a voltage controlled oscillator (VCO), wherein the VCO includes a ring oscillator including delay buffers coupled in a loop, a current source, and a push-pull circuit, and wherein the push-pull circuit includes a push transistor coupled between a supply rail and an output of the push-pull circuit, and a pull transistor coupled between the output of the push-pull circuit and a low rail, the method comprising applying a control voltage to both a gate of the push transistor and a gate of the pull transistor to generate a bidirectional current;

combining a current from the current source with the bidirectional current into a combined current;

generating a set of currents based on the combined current using a current mirror; and providing each current in the set of currents to a respective one of the delay buffers in the ring oscillator.

14. The method of claim 13, wherein the push transistor comprises a p-type field effect transistor (PFET) and the pull transistor comprises an n-type field effect transistor (NFET).

15. The method of claim 13, wherein each of the delay buffers comprises a current-starved inverter.

16. A system, comprising:

a voltage controlled oscillator (VCO), comprising:

a ring oscillator including delay buffers coupled in a loop;

a push-pull circuit having an input and an output;

a current mirror having an input terminal and output terminals, wherein the input terminal of the current mirror is coupled to the output of the push-pull circuit, and each of the output terminals of the current mirror is coupled to a respective one of the delay buffers; and a current source coupled to the input terminal of the current mirror;

a phase detector having a first input, a second input, a first output, and a second output, wherein the first input of the phase detector is configured to receive a reference signal;

a frequency divider coupled between the ring oscillator and the second input of the phase detector;

a charge pump having a first input, a second input, and an output, wherein the first input of the charge pump is coupled to the first output of the phase detector, and the second input of the charge pump is coupled to the second output of the charge pump; and a loop filter coupled between the output of the charge pump and the input of the push-pull circuit.

17. The system of claim 16, wherein the push-pull circuit comprises:

a push transistor coupled between a supply rail and the output of the push-pull circuit, wherein a gate of the push transistor is coupled to the input of the push-pull circuit; and a pull transistor coupled between the output of the push-pull circuit and a low rail, wherein a gate of the pull transistor is coupled to the input of the push-pull circuit.

* * * * *